United States Patent
Weng et al.

(10) Patent No.: US 6,757,640 B2
(45) Date of Patent: Jun. 29, 2004

(54) METHOD AND APPARATUS FOR DETERMINING AND ASSESSING CHAMBER INCONSISTENCY IN A TOOL

(75) Inventors: Hung-Jen Weng, Pan-Chiao (TW); Enk Klaus, Hsinchu (TW)

(73) Assignee: Promos Technologies Inc., Hsinchu (TW)

(*) Notice: Subject to any disclaimer, the term of this patent is extended or adjusted under 35 U.S.C. 154(b) by 0 days.

(21) Appl. No.: 10/371,988

(22) Filed: Feb. 21, 2003

(65) Prior Publication Data

US 2003/0233745 A1 Dec. 25, 2003

Related U.S. Application Data

(62) Division of application No. 09/912,682, filed on Jul. 24, 2001, now Pat. No. 6,537,834.

(51) Int. Cl.⁷ .................................................. G06F 11/30
(52) U.S. Cl. ....................................................... 702/183
(58) Field of Search ........................... 702/183; 73/865.8

(56) References Cited

U.S. PATENT DOCUMENTS 6,073,501 A * 6/2000 Rohner ...................... 73/865.8
6,195,621 B1 * 2/2001 Bottomfield ................ 702/183

* cited by examiner

Primary Examiner—John F. Niebling
Assistant Examiner—Andre' C. Stevenson
(74) Attorney, Agent, or Firm—Birch, Stewart, Kolasch & Birch, LLP

(57) ABSTRACT

A method is disclosed to determine and assess chamber inconsistency in a multi-chambered tool, especially a multi-chambered tool involved in mass production processes. Wafers produced by the tool are grouped in lots measured to obtain loss yield groups. The invention sorts yield losses to obtain a corresponding monotonic sequence. The invention then averages the monotonic sequences. If the resulting mean monotonic sequence fits with a predetermined aberration, the tool is determined to suffer from chamber inconsistency.

6 Claims, 8 Drawing Sheets

METHOD AND APPARATUS FOR DETERMINING AND ASSESSING CHAMBER INCONSISTENCY IN A TOOL

CROSS REFERENCE TO RELATED APPLICATION

This is a divisional application of U.S. patent application Ser. No. 09/912,682, entitled "METHOD AND APPARATUS FOR DETERMINING AND ASSESSING CHAMBER INCONSISTENCY IN A TOOL" filed Jul. 24, 2001 now U.S. Pat. No. 6,537,834.

BACKGROUND OF THE INVENTION

1. Field of the Invention

The present invention relates to a method and apparatus for determining and assessing chamber inconsistency in a tool. In particular, the present invention relates to determining and assessing chamber inconsistency by processing the measurement data obtained by measuring the units of a product.

2. Description of the Related Art

Semiconductor fabrication normally encompasses hundreds of operations to process a blank wafer for the generation of logic integrated circuitry (IC), dynamic random access memory (DRAM), static random access memory, flash memory, and other chips. Each operation responds for a single process, such as lithography, etching, deposition, and oxidation. As part of mass-production, each operation usually has several tools that can execute a corresponding operation. Each tool is usually designed to have multiple chambers to process the same operation in parallel. Theoretically, a single operation needs to produce the same process results. Thus, each chamber of a single tool should produce equal and identical results.

In semiconductor fabrication, yield, whether wafer yield or chip yield, signifies the cost and profit of a fabrication process. In order to maximize yield, the most unproductive operation or tool is first located, and then proper action, such as adjustment or repair, must be performed. Incidents, however, in which production by one or more chambers of a tool differs significantly form that of the other chambers, defined as chamber inconsistency, is very hard to identify.

For the purpose of convenient transportation and management, wafers in semiconductor fabrication are usually gathered in lots. Presently, 8-inch fabrication puts 25 wafers in a cassette, referred to as a lot. The cassette bears a lot number. Furthermore, each wafer has a wafer number marked on its surface. For example, the wafer number 05 in the lot "65038" means that the corresponding wafer is the 5$^{th}$ wafer in the lot numbered 65038. Lots may not be full, that is, having fewer than 25 wafers. During operations, some wafers in a lot may be abandoned due to misoperation. Therefore, the number of wafers in a lot can be anywhere from 1 to 25.

Determination of this chamber inconsistency faces the following impediments:

1. Chamber inconsistency is not identifiable from commonly accessed data, such as average yield or average bit loss, of lots.
2. Wafer numbers have no fixed correlation to the chambers of a tool. Each wafer is randomly chosen to be processed in a chamber. Chamber inconsistency thus cannot be identified by checking wafers with the same wafer number.

SUMMARY OF THE INVENTION

An object of the present invention is to determine and assess whether a tool with multiple chambers has chamber inconsistency.

The method for determining chamber inconsistency of a single tool according to the present invention is applied to a process flow for manufacturing a product. The tool has a plurality of process chambers. A plurality of product groups is provided. Each the product groups has a plurality of units and has been processed in the process chambers of the tool. The product groups are measured to obtain measurement data groups. Each measurement data group comprises a plurality of measured data corresponding to the units in a corresponding product group. The measured data of the corresponding product group are sorted to obtain a corresponding monotonic sequence. The monotonic sequences corresponding to the product groups are element-by-element averaged to obtain a mean monotonic sequence. If the mean monotonic sequence fits in with a predetermined criterion, the tool is indicated to have chamber inconsistency.

The product groups and the units can be lots and wafers, respectively. The measured data can be resistance, capacitance, chip yield or failed bit number of a lot.

The predetermined criterion, for example, can be that the mean monotonic sequence has a step variation in a medial position, or that the mean monotonic sequence is out of a predetermined distribution.

This invention further provides a method for determining chamber inconsistency in several tools. First, the mean monotonic sequences corresponding to the tools are ascertained according to the present invention. The chamber inconsistency of the tools can be determined by checking these mean monotonic sequences.

Except via step variation and predetermined distribution, a tool can be determined to have chamber inconsistency if its corresponding mean monotonic sequence is unique among these mean monotonic sequences.

The present invention further provides an apparatus for determining chamber inconsistency in a tool. This apparatus is applied to a process flow for manufacturing a product. The tool has a plurality of process chambers. The apparatus comprises a plurality of product groups, measurement data provider, a sorter, a means for averaging and a system of analysis. Each the product groups has a plurality of units of the product and has been processed in the process chambers of the tool. The measurement data provider provides measurement data groups, each comprising a plurality of measured data obtained by measuring the units in a corresponding product group. The sorter sorts the measured data of the corresponding product group to obtain a corresponding monotonic sequence. The monotonic sequences corresponding to the product groups are averaged, element by element, to obtain a mean monotonic sequence. The system of analysis indicates that the tool has chamber inconsistency if the mean monotonic sequence fits in with a predetermined criterion.

The advantage of the present invention is that the chamber inconsistency in a tool is clearly and precisely determined so proper action can be quickly taken to improve the yield, thereby increasing profits.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

The essence of the present invention mainly has three steps: the first step is sorting, lot by lot, the measurement data of the lots processed by a possibly inconsistent tool to obtain monotonic sequences; the second step is averaging the monotonic sequences to obtain a mean monotonic; and the third step is determining and assessing whether the tool has chamber inconsistency according to the mean monotonic sequence.

Figure 1:
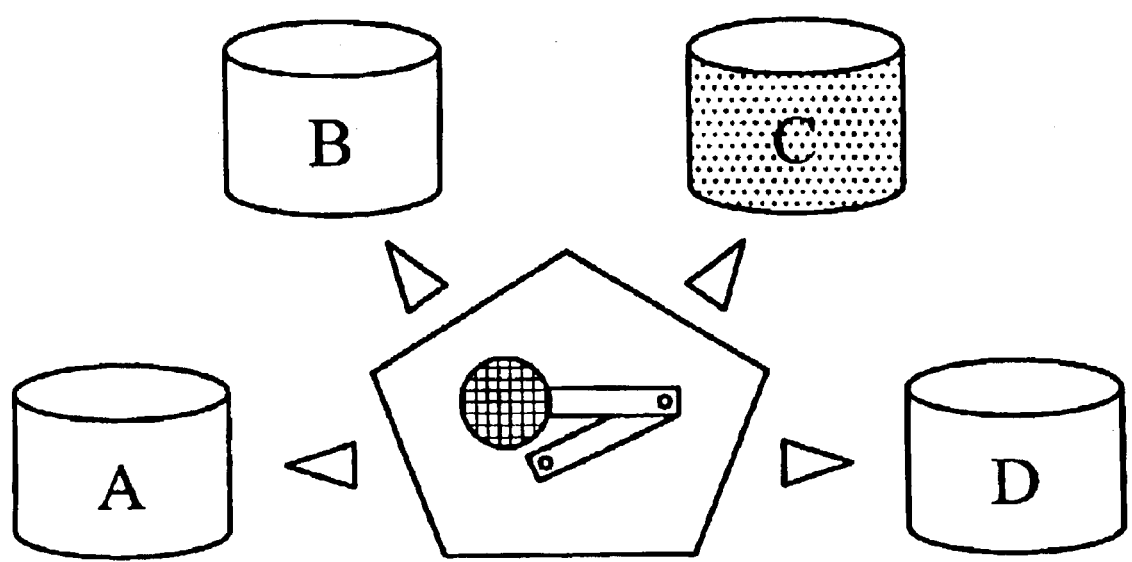
FIG. 1 depicts a tool with chamber inconsistency.

FIG. 1 depicts a tool having chamber inconsistency. Chamber C is shown as to indicate it is inconsistent with the other three chambers. The wafers processed in chamber C will have significant differences in performance in comparison with the wafers processed in other chambers. Yield loss, a kind of measured data, is used as an example of the performance of a wafer, but does not limit the application of the present invention.

Figure 2A:
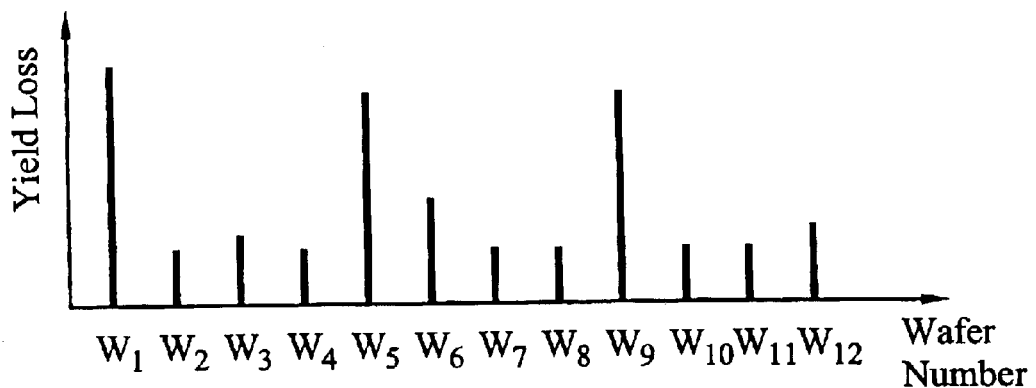
FIG. 2A depicts the yield losses of 12 wafers in the lot process in the tool of FIG. 1, arranged according to the wafer number.

FIG. 2A depicts the yield losses of 12 wafers in the lot process in the tool of FIG. 1, arranged according to the wafer number. Wafers $W_1$, $W_5$ and $W_9$ have been processed in chamber C, and, thus, have distinguishable yield losses. Other wafers, such as $W_2$, $W_3$, $W_7$, having been processed in chamber A, B or C, have smaller yield losses.

Figure 2B:
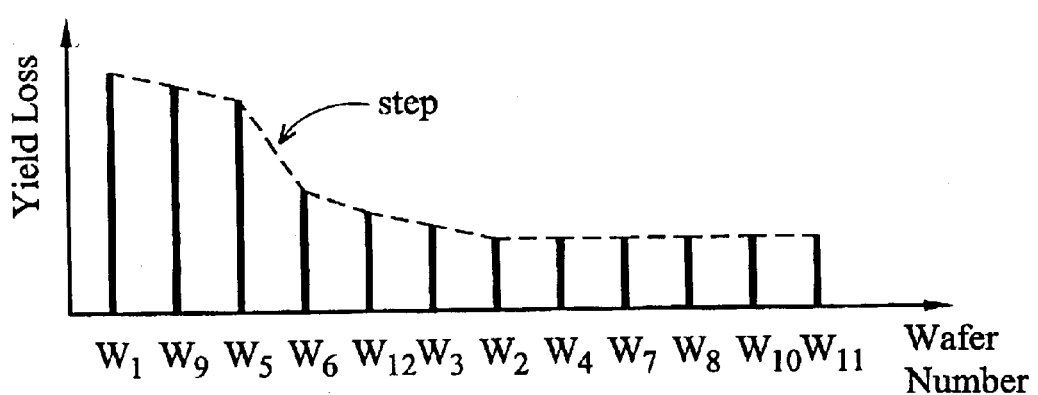
FIG. 2B depicts the sorted result of the yield losses of the wafers in FIG. 2A.

FIG. 2B depicts the sorted result of the yield losses of the wafers in FIG. 2A. The yield losses in FIG. 2B are arranged from large to small. The yield losses of $W_1$, $W_5$ and $W_9$ are larger and they, therefore, are arranged in the front ones. The yield losses of other wafers are smaller and are arranged in the rear ones. Such arrangement of yield losses constructs a monotonic sequence. In FIG. 2B, a significant step variation (abrupt change) can be found in the location between the $3^{rd}$ element and the $4^{th}$ element, and is utilized to determine the chamber inconsistency of the tool according to the present invention.

Figure 3:
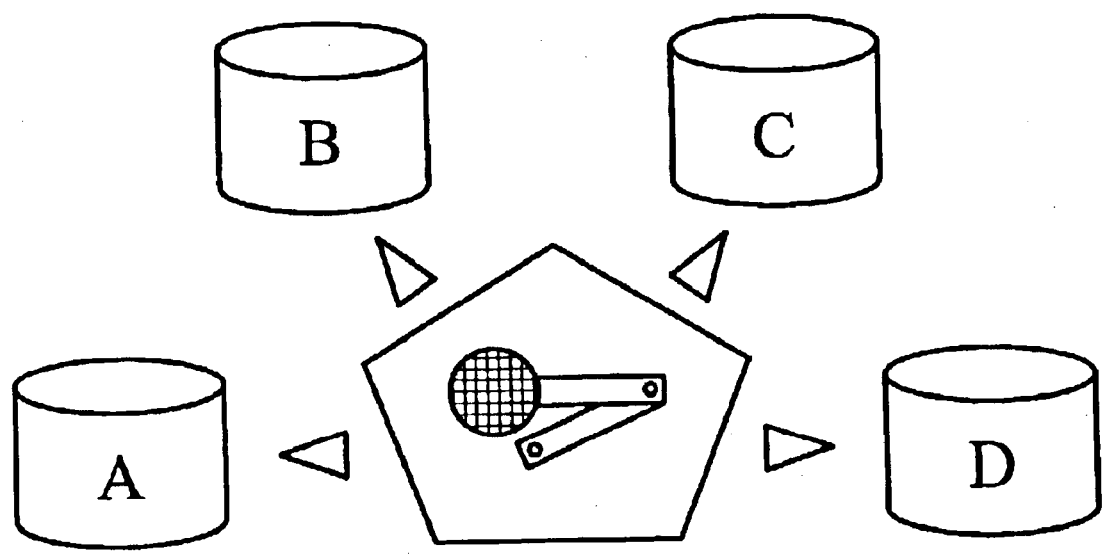
FIG. 3 depicts a multiple-chamber tool without chamber inconsistency.

As a comparable example, FIG. 3 depicts a multiple-chamber tool without chamber inconsistency. The chambers (A, B, C and D) of the tool in FIG. 3 are about the same and generate similar process results.

Figure 4A:
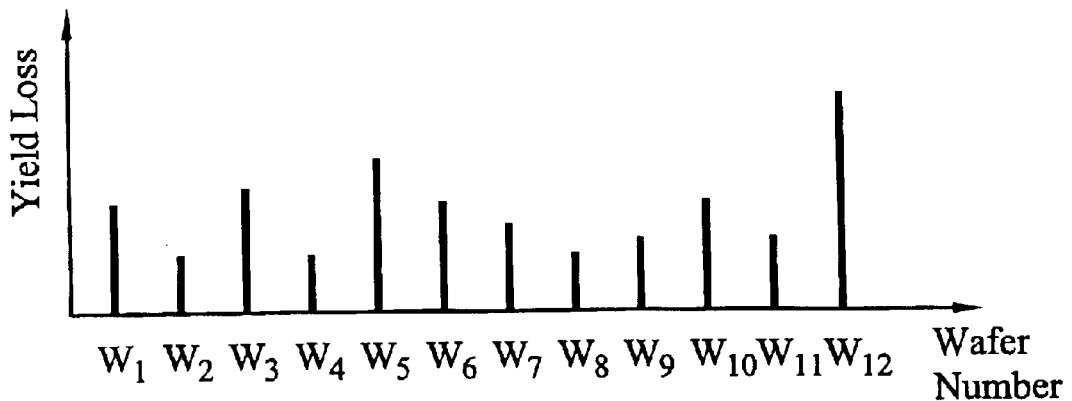
FIG. 4A depicts the yield losses of 12 wafers in the lot process in the tool of FIG. 3, arranged according to the wafer number.

FIG. 4A depicts the yield losses of 12 wafers in the lot process in the tool of FIG. 3, arranged according to the wafer number. As mentioned in the last paragraph, all the yield losses are similar due to the similarity of the 4 chambers in FIG. 3.

Figure 4B:
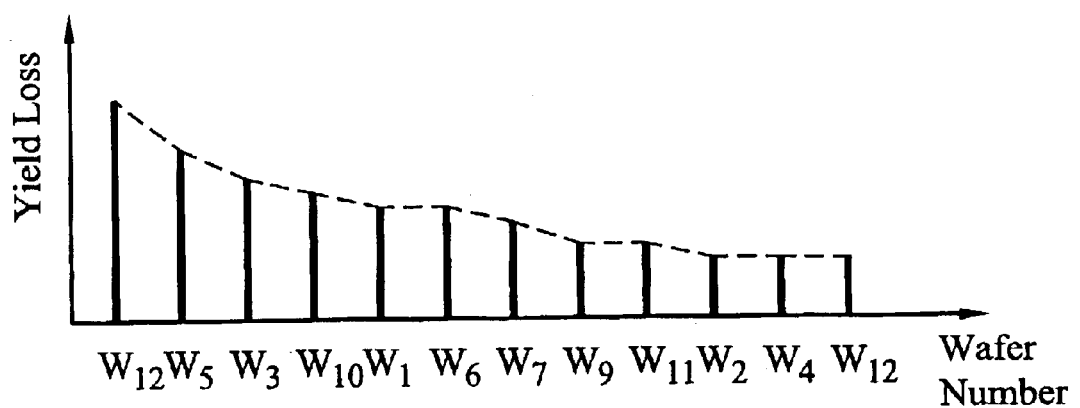
FIG. 4B depicts the sorted result of the yield losses of the wafers in FIG. 4A.

FIG. 4B depicts the sorted result of the yield losses of the wafers in FIG. 4A. After sorting, FIG. 4B shows a monotonic sequence steady decreased as the number of the element increases. In other words, there is no step variation (abrupt change) within the monotonic sequence in FIG. 4B.

Figure 5:
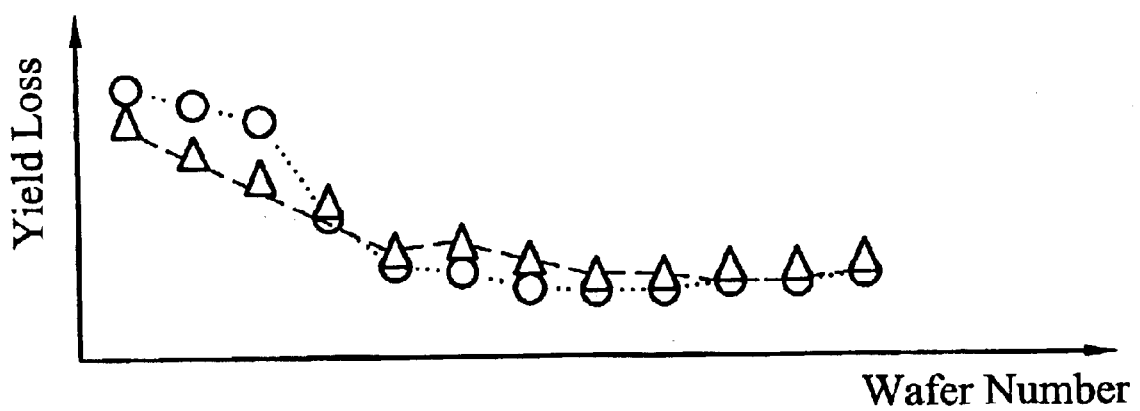
FIG. 5 shows the monotonic sequences in FIGS. 2B and 4B.

FIG. 5 shows the monotonic sequences in FIGS. 2B and 4B, where the curve marked by circles represents the monotonic sequence in FIG. 2B while the one marked by triangles represents the monotonic sequence in FIG. 4B. By comparing the two curves in FIG. 5, one can find that the most difference between them is the occurrence of the step variation. The curve marked by circles (corresponding to a tool with chamber inconsistency) has a significant step variation between the $3^{rd}$ element and the $4^{th}$ element. Nevertheless, the curve marked by triangle (corresponding to a tool without chamber inconsistency) has no step variation therein. The criterion for deciding variation as step variation is predetermined by engineers, dependent upon product, process ability, experience, requirement, and other suitable parameters. The occurrence of step variation is the key point for determining and assessing whether a tool has chamber inconsistency in this invention.

The measured data from a single lot is not enough to determine whether a tool has chamber inconsistency or not since what happens to the single lot may be an accidental event. Thus, the present invention applies the average skill of statistics. The monotonic sequences of corresponding lots having been processed by a tool can be generated according to the previous paragraphs. By averaging, element by element, the monotonic sequences, a mean monotonic sequence is generated to represent the performance of the corresponding tool. By examining the mean monotonic sequence, whether the corresponding tool has chamber inconsistency can be determined.

Figure 6A:
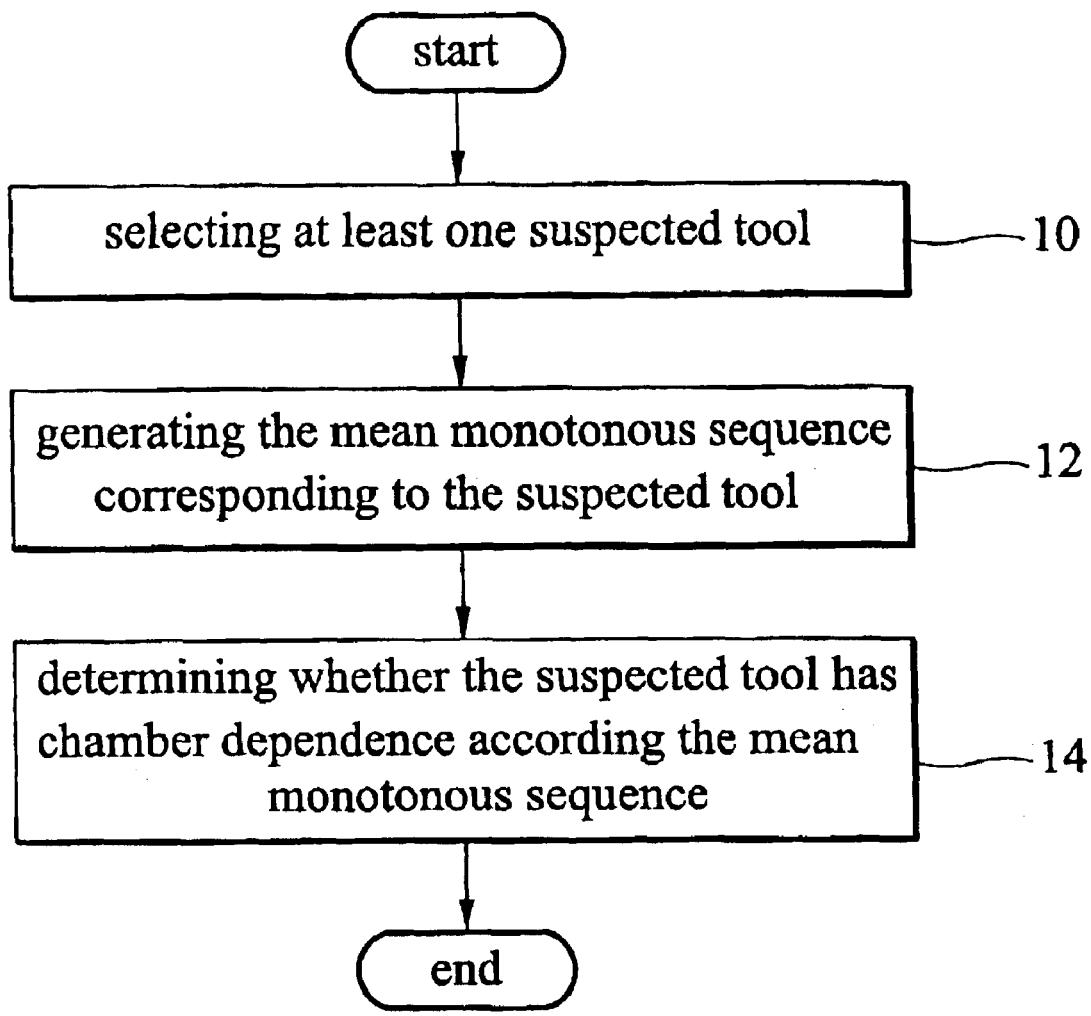
FIG. 6A illustrates the flowchart for determining chamber inconsistency of a possibly inconsistent tool.

FIG. 6A illustrates the flowchart for determining and assessing chamber inconsistency in a possibly inconsistent tool.

First, at least one possibly inconsistent tool, which is expected to have inconsistent chamber(s) in view of production, is selected (symbol 10). This step can be made by experienced engineers or by computer programs. For example, when the failed dies (or chips) during testing have specific failure bins or construct a specific pattern, experienced engineers can choose at least one tool as a possibly inconsistent tool which contributes to the failure according to their work experience.

The mean monotonic sequence corresponding to the possibly inconsistent tool is then generated (symbol 12). This mean monotonic sequence, whose origination will be explained later, represents the statistic performance of the wafers in a lot processed by the possibly inconsistent tool.

Whether the possibly inconsistent tool has chamber inconsistency is then determined according the mean monotonic sequence (symbol 14). For example, if there is a step variation within the mean monotonic sequence, the possibly inconsistent tool has chamber inconsistency. Another criterion for determining chamber inconsistency is described as follows. The mean monotonic sequence for a tool without chamber inconsistency should have an appearance of an almost smooth curve, such as the curve marked by triangles in FIG. 5. By collecting the mean monotonic sequences corresponding to the tools provably without chamber inconsistency, one can conclude that a tool without chamber inconsistency must correspond to a mean monotonic sequence fitting with a certain mathematical equation, which can be found by statistics. If a possibly inconsistent tool has a mean monotonic sequence being out of a predetermined distribution determined by the certain mathematical equation, the possibly inconsistent tool can be determined or assessed to have chamber inconsistency. Furthermore, several possibly inconsistent tools can correspond to generate mean monotonic sequences. If one of the mean monotonic sequences is unique to the others, the corresponding possibly inconsistent tool has chamber inconsistency, since the tools with chamber inconsistency are usually rare in comparison with hundreds of tools in a fabrication operation. The described criteria can be achieved by software programming.

Figure 6B:
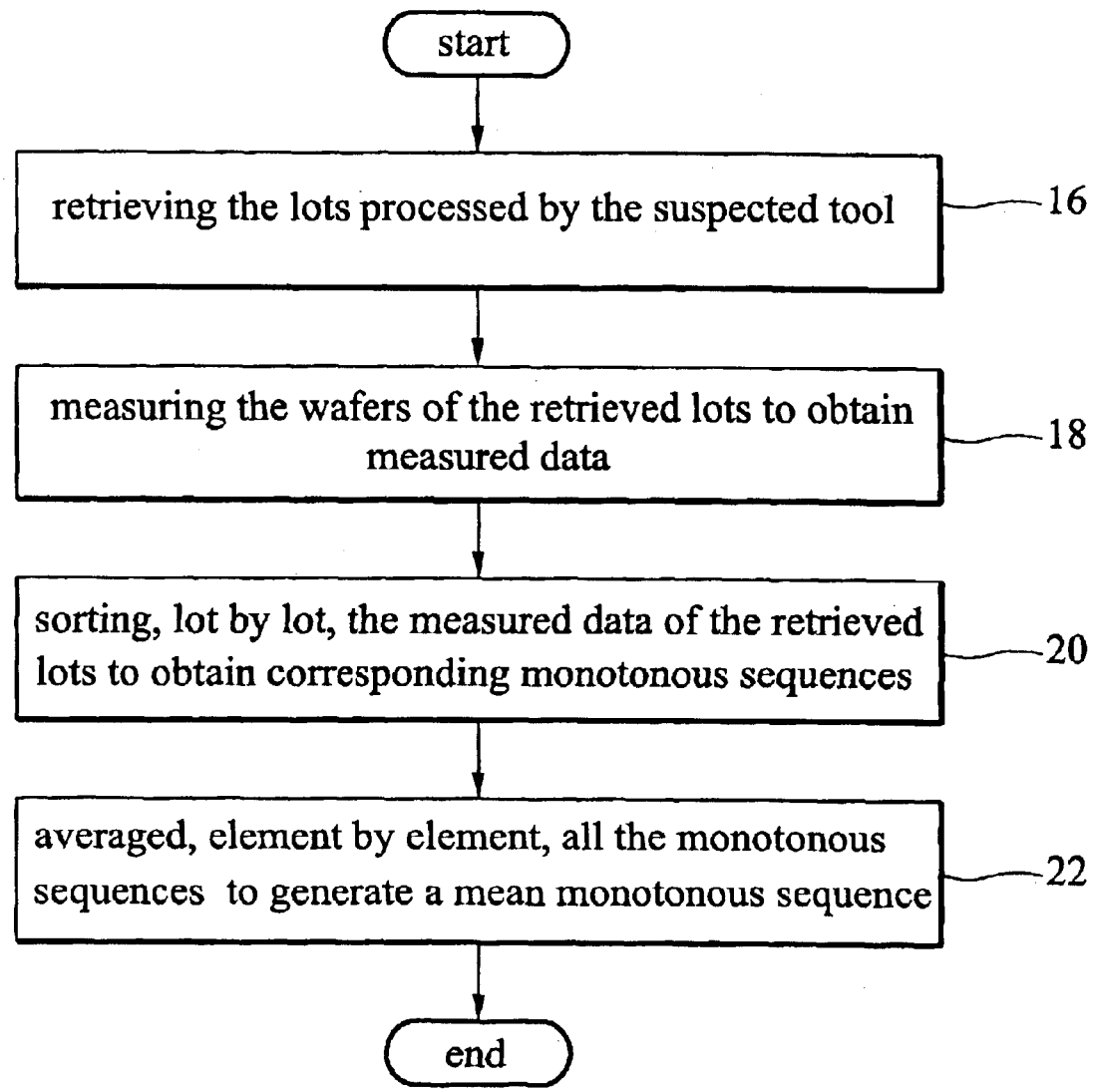
FIG. 6B illustrates the flowchart for generating the mean monotonic sequence in FIG. 6A.

FIG. 6B illustrates the flowchart for generating the mean monotonic sequence in FIG. 6A.

The lots processed by the possibly inconsistent tool are retrieved (symbol 16). In order to make sure that each retrieved lot is a common representative of the performance of the possibly inconsistent tool, each the retrieved lots is suggested to have wafers more than a certain number, for example, over 80% of the maximum capacity of a lot. By now, the 80% of the maximum capacity of a lot in an 8-inch wafer fabrication is equal to 20.

The wafers of the retrieved lots are measured to obtain measured data (symbol 18), such as yield losses. For instance, if there are 21 wafers in a retrieved lot, 21 corresponding yield losses are collected.

The measured data of the retrieved lots are sorted lot by lot to obtain corresponding monotonic sequences (symbol 20). For example, the 21 yield losses of a lot are sorted to construct a monotonic sequence with 21 elements. All the monotonic sequences are either increasing sequences or decreasing sequences.

All the monotonic sequences are averaged element by element to generate a mean monotonic sequence (symbol 22). The $1^{st}$ element of the mean monotonic sequence is obtained by averaging all the $1^{st}$ elements in the monotonic sequences. The $2^{nd}$ element of the mean monotonic sequence is obtained by averaging all the $2^{nd}$ elements in the monotonic sequences, and so on. Due to the different element numbers in different monotonic sequences, one can 1) ignore the shorter monotonic sequences to generate the last elements of the mean monotonic sequence by averaging the monotonic sequences with last elements; 2) limit the length of the mean monotonic sequence to be equal to that of the shortest monotonic sequence(s); and 3) set a fixed value to the rear empty elements in the shorter monotonic sequences and obtain the mean monotonic sequence. The fixed value is the smallest possible value if the monotonic sequences are decreasing sequences, vice versa.

Figure 7:
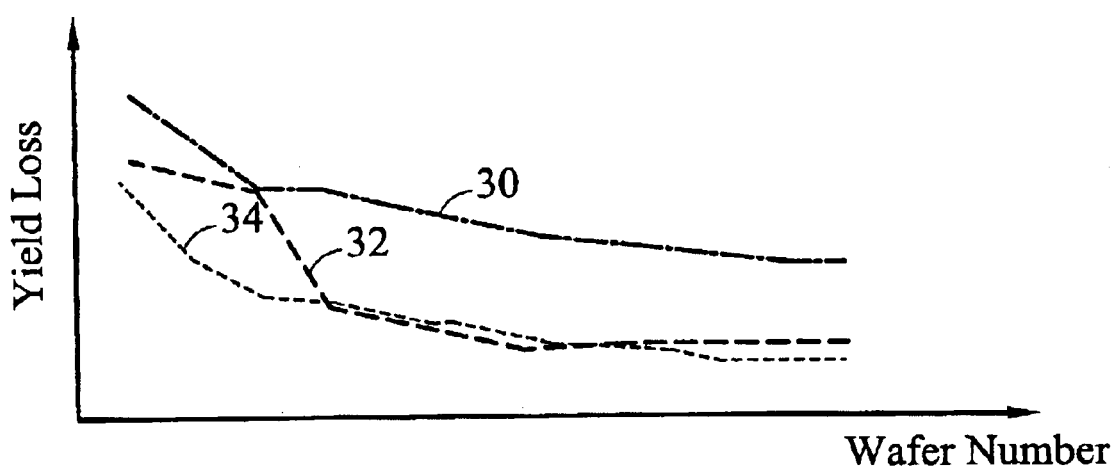
FIG. 7 illustrates 3 curves for representing 3 mean monotonic sequences.

FIG. 7 illustrates 3 curves for representing 3 mean monotonic sequences. In FIG. 7, curves 30 and 34 have no step variation therein. However, curve 32 has a step variation in a medial position, therefore the tool corresponding to the curve 32 can be determined to have chamber inconsistency. Curves 30 and 34 are very similar to an exponential curve, such as $Ae^{-Bx}$, which is a non-match for curve 32. Therefore, the tool corresponding to curve 32 can be determined to have chamber inconsistency according to its incompatibility with the mathematical equation.

The medial position refers to the position not located within the first several elements or the last several elements. The detail explanation follows. If, for example, most of the retrieved lots have 25 wafers in a lot, and the tool with chamber inconsistency has a total of two chambers but one inconsistent chamber therein, and the location of the step variation of the mean monotonic sequence should be around the $13^{th}(=25*\frac{1}{2})$ element. By the same theory, if most of the retrieved lots have 25 wafers per lot, and the tool with chamber inconsistency has a total of five chambers, the location of the step variation of the mean monotonic sequence should be around the $5^{th}$, $10^{th}$, $15^{th}$ or $20^{th}$, respectively corresponding to the total number 1, 2, 3 or 4 of the inconsistent chamber(s). That is, the mean monotonic sequence, or the location of the step variation, can indicate the total number of the inconsistent chamber(s) or the ratio of the inconsistent chamber(s) to the total chambers. The majority of tools have 5 chambers or fewer. Therefore, a step variation can be ignored if it occurs at the location prior the $5^{th}$ element or later the $20^{th}$ element.

Of course, as well as using a yield loss as measured data, any one of the measured data representing the characteristic of a wafer can be utilized in this invention. For example, a yield loss, a failed bit number, an average N-well resistance, a PN junction capacitance of a wafer.

In addition to semiconductor fabrication, the present invention can also employed to other kinds of mass-production for different products, thereby determining and assessing chamber inconsistency in any multi-chambered tool.

Finally, while the invention has been described by way of examples and in terms of the preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A apparatus for determining chamber inconsistency in a tool, applied to a process flow for manufacturing a product, the tool having a plurality of process chambers, comprising:
    a plurality of product groups, each the product groups having a plurality of units of the product and having been processed in the process chambers of the tool;
    measurement data provider for providing measurement data groups, each measurement data group comprising a plurality of measured data obtained by measuring the units in a corresponding product group;
    a sorter for sorting the measured data of the corresponding product group to obtain an corresponding monotonic sequence;
    a means for averaging, element by element, the monotonic sequences corresponding to the product groups to obtain a mean monotonic sequence; and
    a system of analysis for, if the mean monotonic sequence fits in with a predetermined criterion, indicating the tool has chamber inconsistency.

2. The apparatus as claimed in claim 1, wherein the predetermined criterion is that the mean monotonic sequence has a step variation in a medial position.

3. The apparatus as claimed in claim 1, wherein the predetermined criterion is that the mean monotonic sequence is out of a predetermined distribution.

4. The apparatus as claimed in claim 1, wherein the product groups are lots comprising a plurality of wafers.

5. The apparatus as claimed in claim 1, wherein each lot has a maximum capacity of 25 wafers.

6. The apparatus as claimed in claim 4, wherein each lot has a maximum capacity and the wafers in each lot have a total number larger than a predetermined ratio of the maximum capacity.

* * * * *